(12) United States Patent
Hsu et al.

(10) Patent No.: US 11,996,340 B2
(45) Date of Patent: May 28, 2024

(54) PASSIVATION LAYER FOR PROTECTING SEMICONDUCTOR STRUCTURES

(71) Applicant: Taiwan Semiconductor Manufacturing Company, Ltd., Hsinchu (TW)

(72) Inventors: Yao-Wen Hsu, New Taipei (TW); Ying-Liang Chuang, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/395,157

(22) Filed: Aug. 5, 2021

(65) Prior Publication Data

US 2023/0039596 A1 Feb. 9, 2023

(51) Int. Cl.
| | |
|---|---|
| *H01L 27/092* | (2006.01) |
| *H01L 21/027* | (2006.01) |
| *H01L 21/56* | (2006.01) |
| *H01L 21/8238* | (2006.01) |
| *H01L 23/29* | (2006.01) |
| *H01L 23/31* | (2006.01) |
| *H01L 29/26* | (2006.01) |
| *H01L 29/40* | (2006.01) |
| *H01L 29/423* | (2006.01) |
| *H01L 29/66* | (2006.01) |
| *H01L 29/78* | (2006.01) |

(52) U.S. Cl.
CPC ...... *H01L 23/3171* (2013.01); *H01L 21/0276* (2013.01); *H01L 21/56* (2013.01); *H01L 21/823821* (2013.01); *H01L 23/291* (2013.01); *H01L 27/0924* (2013.01); *H01L 29/26* (2013.01); *H01L 29/401* (2013.01); *H01L 29/4236* (2013.01); *H01L 29/66795* (2013.01); *H01L 29/7851* (2013.01)

(58) Field of Classification Search
CPC ......... H01L 21/0276; H01L 21/823821; H01L 29/66795; H01L 29/401; H01L 29/435; H01L 21/28088; H01L 21/3205
See application file for complete search history.

(56) References Cited

U.S. PATENT DOCUMENTS

| | | | |
|---|---|---|---|
| 2013/0171801 A1* | 7/2013 | Park | C23C 28/04 257/E21.267 |
| 2019/0172830 A1* | 6/2019 | Ok | H01L 21/823807 |
| 2020/0328111 A1* | 10/2020 | Chen | H01L 21/0337 |
| 2021/0376074 A1* | 12/2021 | Tanaka | H01L 21/823878 |

* cited by examiner

*Primary Examiner* — Vu A Vu
*Assistant Examiner* — Valerie N Newton
(74) *Attorney, Agent, or Firm* — FOLEY & LARDNER LLP

(57) ABSTRACT

A method for making a semiconductor structure includes forming a first fin and a second fin over a substrate. The method includes forming one or more work function layers over the first and second fins. The method includes forming a nitride-based metal film over the one or more work function layers. The method includes covering the first fin with a patternable layer. The method includes removing a second portion of the nitride-based metal film from the second fin, while leaving a first portion of the nitride-based metal film over the first fin substantially intact.

20 Claims, 13 Drawing Sheets

US 11,996,340 B2

PASSIVATION LAYER FOR PROTECTING SEMICONDUCTOR STRUCTURES

BACKGROUND

The present disclosure generally relates to semiconductor devices and methods for fabricating semiconductor devices, and particularly to protecting various layers of semiconductor devices during removal steps in the fabrication process. Especially as the size of semiconductor devices continues to decrease, challenges may arise with respect to various removal steps in the fabrication process. Semiconductor devices are used in a wide variety of electronics, and improvements regarding both production and performance of semiconductor devices are generally desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
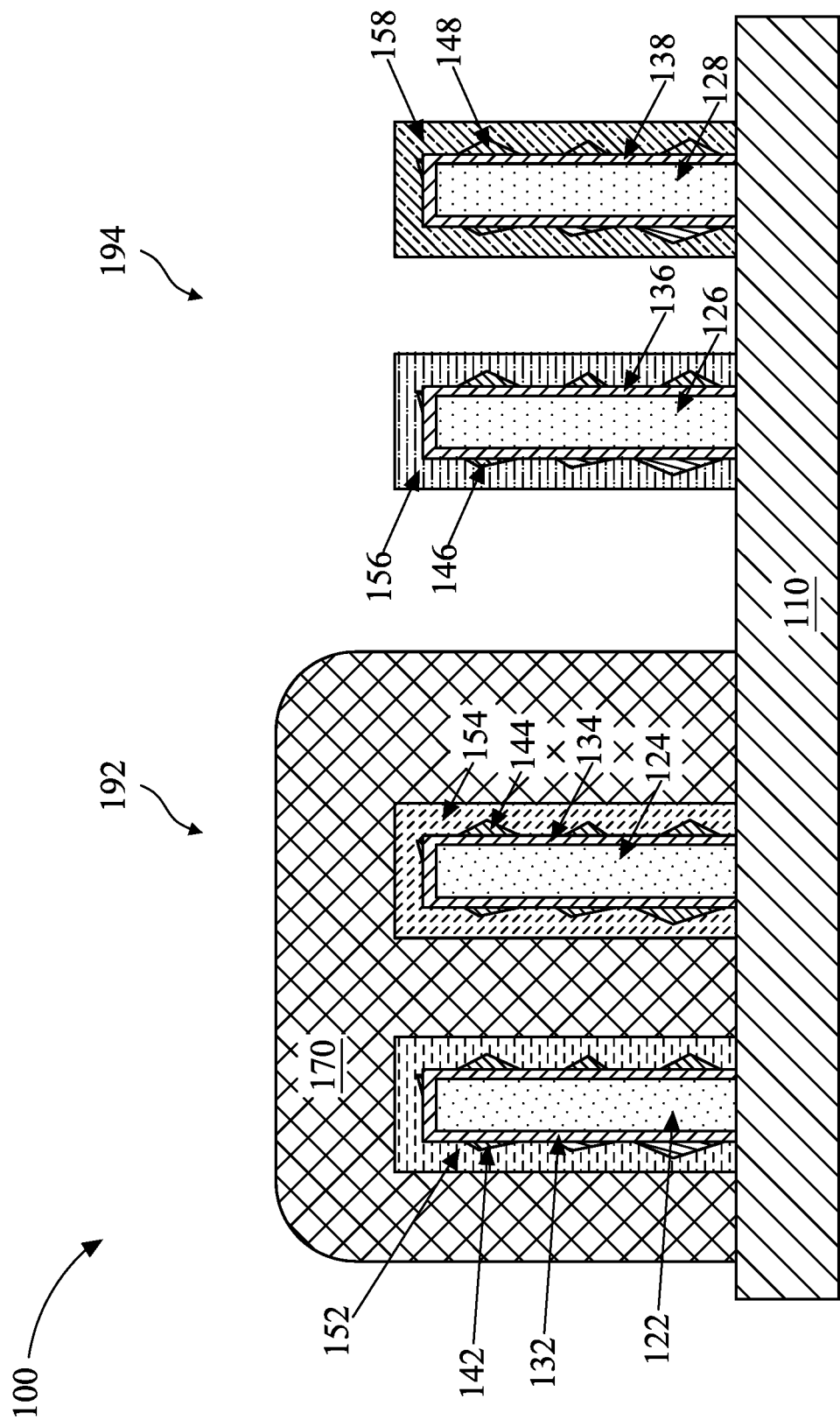
FIG. 1A illustrates a cross section of an example semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides semiconductor structures and methods of fabricating semiconductor structure involving use of a passivation layer during the fabrication process to prevent defects that may occur as a result of etchants (e.g., acids that can provide $OH^-$ and/or $Cl^-$ ions) penetrating through a patternable layer, which generally includes an anti-reflective coating (e.g., one or more BARC layers). Such penetration of etchants (e.g., through the BARC layers) may incur chemical reactions (e.g., $OH^-$ and/or $Cl^-$ ion exchange reactions) with an oxide-based hardmask layer or work function metal layer disposed below the BARC layers, which can disadvantageously generate water-soluble by-products (e.g., aluminium chloride ($AlCl_3$)). Such by-products typically remain over a surface of the hardmask layer (or work function metal layer), even removing the BARC layer. Consequently, a number of blisters (or bubbles) may be formed over the surface of the hardmask layer, which can adversely impact the controllability of tuning a threshold voltage of the semiconductor structure (e.g., a transistor). In various embodiments, the passivation layer, as disclosed herein, can replace the oxide-based hardmask layer or can be formed over the oxide-based hardmask layer. For example, the passivation layer may include nitride-based material, which can significantly limit its chemical reaction with the etchants partially due to its firmer attachment to the BARC layer. As such, the above-described bubble issues can be avoided.

Referring now to FIG. 1A, a cross section of an example semiconductor structure 100 is shown, in accordance with some embodiments. Semiconductor structure 100 is generally a fin field-effect transistor (FinFET) structure. However, the approaches described herein can also be implemented in other transistor structures such as gate-all-around field-effect transistor (GAAFET) structures, and other similar types of transistor structures. Semiconductor structure 100 is generally be implemented in an integrated circuit (IC). Semiconductor structure 100 may be formed during the front-end-of-line (FEOL) process of the IC fabrication process. Semiconductor structure 100 includes a passivation layer for added protection during the fabrication process, as discussed in more detail below.

Semiconductor structure 100 is shown to include a substrate 110. Substrate 110 can be implemented as an n-type substrate or a p-type substrate. For example, substrate 110 can be formed of silicon material (e.g., crystalline silicon) that is doped with an n-type dopant such as arsenic, phosphorous, and other similar dopants. Substrate 110 can also be doped with p-type dopants such as boron and other similar dopants. Substrate 110 can be implemented using a silicon-on-insulator (SOI) structure, a silicon-on-sapphire (SOS) structure, a bulk semiconductor structure, an alloy semiconductor, a compound semiconductor, geranium, and various other suitable materials and combinations thereof. Further, both source and drain regions can be formed over substrate 110. In some embodiments, the source and drain regions are formed using epitaxial growth processes, optionally followed by ion implantation processes. Any suitable doping materials including both n-type and p-type precursor materials can be used to form the source and drain regions such as phosphorous, phosphine, boron, gallium, indium, and other similar materials. Substrate 110 may further include isolation structures at the outer peripheries to prevent crosstalk between devices.

Semiconductor structure 100 is also shown to include a fin 122. Fin 122 is generally formed of semiconductor material and provides a pathway for current to flow in semiconductor structure 100. Fin 122 can be formed using materials such as silicon (Si), silicon germanium (SiGe), and other suitable conductive materials and combinations thereof. One or more gate structures can be formed around fin 122 to form individual transistor devices in a FinFET structure, for example. It will be appreciated that the cross section provided in FIG. 1A illustrates semiconductor structure 100 before such gate structures and other structures are formed. That is, the cross section provided in FIG. 1A illustrates semiconductor structure 100 at a point in time during the fabrication process before the fabrication process is complete.

Semiconductor structure 100 is also shown to include a first work function layer 132. The first work function layer 132 can be implemented in a variety of different ways including using a variety of suitable materials and combinations thereof. The first work function layer 132 is generally used to provide desired work functions for semiconductor devices (e.g., transistors) to control the amount of energy needed to move electrons within semiconductor structure 100. By controlling the work function using the first work function layer 132, semiconductor device performance can be enhanced, for example by improving the threshold voltage needed to operate semiconductor devices in semiconductor structure 100. The first work function layer 132 can be an n-type metal layer (e.g., for NMOS transistors), for example, that is formed using material such as titanium nitride, tantalum, tantalum nitride, and other suitable materials and combinations thereof. The first work function layer 132 can also be a p-type metal layer (e.g., for PMOS transistors), for example, that is formed using materials such as tantalum nitride, tungsten nitride, titanium, titanium nitride, and other suitable materials and combinations thereof. The first work function layer 132 can also be formed using materials such as hafnium, zirconium, titanium, tantalum, aluminum, metal carbides (e.g., hafnium carbide, zirconium carbide, titanium carbide, aluminum carbide, etc.), aluminides, ruthenium, palladium, platinum, cobalt, nickel, conductive metal oxides, and other suitable materials and combinations thereof. The thickness and/or the composition of the work function layer 132 can be fine-tuned to adjust the work function level. The first work function layer 132 can be formed using a variety of suitable deposition processes, including physical vapor deposition, chemical vapor deposition, electrochemical deposition, atomic layer deposition, and other suitable processes and combinations thereof.

Semiconductor structure 100 is also shown to include a second work function layer 142. Along with the first work function layer 132, the second work function layer 142 is generally used to provide desired work functions for semiconductor devices to control the amount of energy needed to move electrons within semiconductor structure 100. The use of both the first work function layer 132 and the second work function layer 142 can provide additional work function control through use of two separate materials. It will be appreciated that the techniques described herein are applicable in a wide variety of semiconductor structures, and any number of work function layers may be used (or no work function layers at all). The use of two work function layers as described herein is merely an example implementation. By controlling the work function using the second work function layer 142, semiconductor device performance can be enhanced, for example by improving the threshold voltage needed to operate semiconductor devices in semiconductor structure 100. The second work function layer 142 can be an n-type metal layer (e.g., for NMOS transistors), for example, that is formed using material such as titanium nitride, tantalum, tantalum nitride, and other suitable materials and combinations thereof. The second work function layer 142 can also be a p-type metal layer (e.g., for PMOS transistors), for example, that is formed using materials such as tantalum nitride, tungsten nitride, titanium, titanium nitride, and other suitable materials and combinations thereof. The second work function layer 142 can also be formed using materials such as hafnium, zirconium, titanium, tantalum, aluminum, metal carbides (e.g., hafnium carbide, zirconium carbide, titanium carbide, aluminum carbide, etc.), aluminides, ruthenium, palladium, platinum, cobalt, nickel, conductive metal oxides, and other suitable materials and combinations thereof. The thickness and/or the composition of the second work function layer 142 can be fine-tuned to adjust the work function level. It should be understood that the shapes of the first and second work function layers, shown in FIG. 1A (and some of the following figures), are non-limiting examples, these work function layers may each be formed in any of various shapes, while remaining within the scope of the present disclosure. For example, although the work function layer 142 (as shown) is formed as a number of islands discretely disposed along the surface of the work function layer 132, the work function layer 142 may be formed as a continuous (e.g., conformal) layer over the work function layer 132, in some other embodiments. The second work function layer 142 can be formed using a variety of suitable deposition processes, including physical vapor deposition, chemical vapor deposition, electrochemical deposition, atomic layer deposition, and other suitable processes and combinations thereof.

Semiconductor structure 100 is also shown to include a passivation layer 152. In various embodiments, passivation layer 152, which may be nitride-based. In some embodiments, the passivation layer 152 may also function as a work function layer (e.g., a third work function layer over the work function layers 132 and 142 to collectively tune the threshold voltage of a transistor adopting the fin 122 as its channel). Passivation layer 152 can be formed using a variety of nitride-based metal materials and combinations thereof such as, for example, aluminum nitride (AlN), titanium nitride (TiN), silicon nitride (SiN), tantalum nitride (TaN), gallium nitride (GaN), magnesium nitride ($Mg_3N_2$), and boron nitride (BN), and other nitrogen-contained metal films. Passivation layer 152 is generally a film that replaces a typical hardmask layer (e.g., mask layer 252 described below). The use of passivation layer 152 can prevent defects such as formation of blisters in an anti-reflective coating layer 170 and/or over the surface of the passivation layer 152 (which will be discussed below) due to the chemical makeup of passivation layer 152. Passivation layer 152 can be formed using a variety of suitable deposition processes, including physical vapor deposition (PVD), chemical vapor deposition (CVD), electrochemical deposition, atomic layer deposition (ALD), and other suitable processes and combinations thereof. In the embodiment shown in FIG. 1A, the passivation layer 152 is used instead of a separate hardmask layer.

Semiconductor structure 100 is also shown to include an anti-reflective coating 170, which is a patternable layer. Anti-reflective coating 170 can be implemented as a bottom anti-reflective coating (BARC) layer, for example. Anti-reflective coating 170 is generally used to facilitate photolithography processes by controlling reflectivity. Anti-reflective coating 170 can control reflectivity through careful selection of material to control the refractive index of anti-reflective coating 170 as well as the thickness of anti-reflective coating 170. Anti-reflective coating 170 can be formed using a variety of materials such as silicon oxide, silicon nitride, silicon oxynitride, amorphous carbon, titanium oxide, titanium oxynitride, and other suitable materials and combinations thereof. Anti-reflective coating 170 can be formed using a variety of suitable processes, such as chemical vapor deposition, physical vapor deposition, electrochemical deposition, atomic layer deposition, and other suitable processes and combinations thereof.

Semiconductor structure 100 is also shown to include a fin 124, a first work function layer 134, a second work function layer 144, and a passivation layer 154. These structures are similar to or the same as fin 122, the first work function layer 132, the second work function layer 142, and passivation layer 152, respectively. These structures are formed in a dark region 192 of semiconductor structure 100 where anti-reflective coating 170 is applied. Semiconductor structure 100 is also shown to include an open region 194 where anti-reflective coating 170 is not applied. Open region 194 is shown to include a fin 126, a first work function layer 136, a second work function layer 146, a passivation layer 156, a fin 128, a first work function layer 138, a second work function layer 148, and a passivation layer 158. These structures are also similar to or the same as fin 122, the first work function layer 132, the second work function layer 142, and passivation layer 152, respectively.

By forming the nitride-based passivation layer 152/154, as disclosed herein, the anti-reflective coating 170 can firmly attach to the nitride-based passivation layer 152/154. As such, even penetrating through the anti-reflective coating 170, etchants that are configured to pattern the passivation layers formed over the fins in the open region 194 (e.g., 156, 158) can barely react with the passivation layer 152/154. Consequently, the above-described bubble issues can be avoided, which can assure accurate controllability on a threshold voltage of the semiconductor structure 100. Without the bubble issues, a window of the etchants (e.g., the number of available etchants, the etching condition of each etchant, etc.) can be significantly increased, which can facilitate fabrication of the semiconductor structure 100.

Figure 1B:
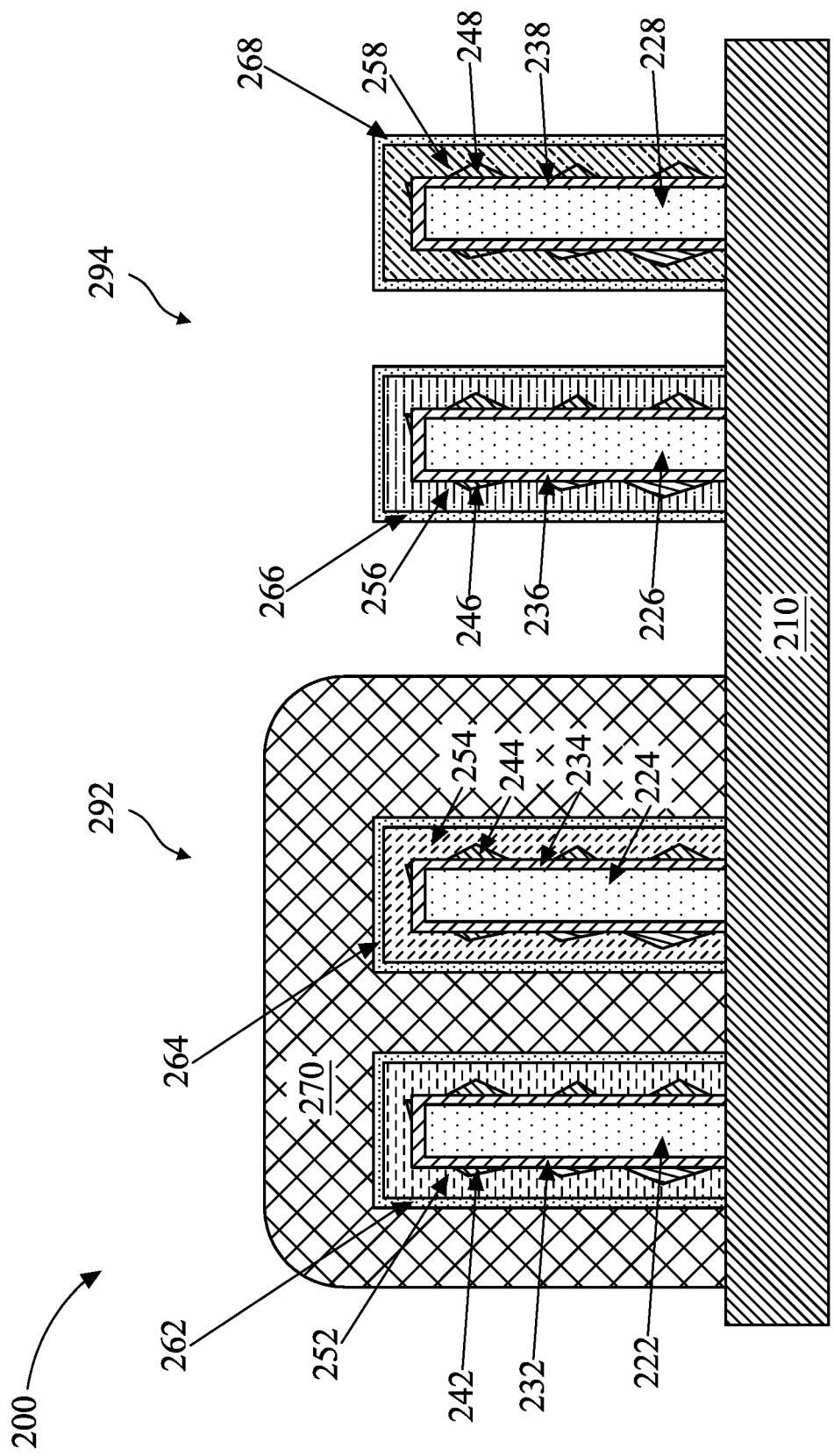
FIG. 1B illustrates a cross section of another example semiconductor structure, in accordance with some embodiments.

Referring now to FIG. 1B, a cross section of an example semiconductor structure 200 is shown, in accordance with some embodiments. In contrast to the embodiment shown in FIG. 1A, the semiconductor structure 200 utilizes a passivation layer over a mask layer. Semiconductor structure 200 is generally a fin field-effect transistor (FinFET) structure. However the approaches described herein can also be implemented in other transistor structures such as gate-all-around field-effect transistor (GAAFET) structures, and other similar types of transistor structures. Semiconductor structure 100 is generally be implemented in an integrated circuit (IC). Semiconductor structure 200 may be formed during the front-end-of-line (FEOL) process of the IC fabrication process. Semiconductor structure 200 includes a passivation layer formed over a hardmask layer for protection during the fabrication process, as discussed in more detail below.

Semiconductor structure 200 is shown to include a substrate 210. Substrate 210 can be implemented as an n-type substrate or a p-type substrate. For example, substrate 210 can be formed of silicon material (e.g., crystalline silicon) that is doped with an n-type dopant such as arsenic, phosphorous, and other similar dopants. Substrate 210 can also be doped with p-type dopants such as boron and other similar dopants. Substrate 210 can be implemented using a silicon-on-insulator (SOI) structure, a silicon-on-sapphire (SOS) structure, a bulk semiconductor structure, an alloy semiconductor, a compound semiconductor, geranium, and various other suitable materials and combinations thereof. Further, both source and drain regions can be formed in substrate 210. In some embodiments, the source and drain regions are formed using ion implantation processes. Any suitable doping materials including both n-type and p-type precursor materials can be used to form the source and drain regions such as phosphorous, phosphine, boron, gallium, indium, and other similar materials. Substrate 210 may further include isolation structures at the outer peripheries to prevent crosstalk between devices.

Semiconductor structure 200 is also shown to include a fin 222. Fin 222 is generally formed of semiconductor material and provides a pathway for current to flow in semiconductor structure 200. Fin 222 can be formed using materials such as silicon (Si), silicon germanium (SiGe), and other suitable conductive materials and combinations thereof. One or more gate structures can be formed around fin 222 to form individual transistor devices in a FinFET structure, for example. It will be appreciated that the cross section provided in FIG. 1B illustrates semiconductor structure 200 before such gate structures and other structures are formed. That is, the cross section provided in FIG. 1B illustrates semiconductor structure 200 at a point in time during the fabrication process before the fabrication process is complete.

Semiconductor structure 200 is also shown to include a first work function layer 232. The first work function layer 232 can be implemented in a variety of different ways including using a variety of suitable materials and combinations thereof. The first work function layer 232 is generally used to provide desired work functions for semiconductor devices (e.g., transistors) to control the amount of energy needed to move electrons within semiconductor structure 200. By controlling the work function using the first work function layer 232, semiconductor device performance can be enhanced, for example by improving the threshold voltage needed to operate semiconductor devices in semiconductor structure 200. The first work function layer 232 can be an n-type metal layer (e.g., for NMOS transistors), for example, that is formed using material such as titanium nitride, tantalum, tantalum nitride, and other suitable materials and combinations thereof. The first work function layer 232 can also be a p-type metal layer (e.g., for PMOS transistors), for example, that is formed using materials such as tantalum nitride, tungsten nitride, titanium, titanium nitride, and other suitable materials and combinations thereof. The first work function layer 232 can also be formed using materials such as hafnium, zirconium, titanium, tantalum, aluminum, metal carbides (e.g., hafnium carbide, zirconium carbide, titanium carbide, aluminum carbide, etc.), aluminides, ruthenium, palladium, platinum, cobalt, nickel, conductive metal oxides, and other suitable materials and combinations thereof. The thickness and/or the composition of the work function layer 232 can be fine-tuned to adjust the work function level. The first work function layer 232 can be formed using a variety of suitable deposition processes, including physical vapor deposition, chemical vapor deposition, electrochemical deposition, atomic layer deposition, and other suitable processes and combinations thereof.

Semiconductor structure 200 is also shown to include a second work function layer 242. Along with the first work function layer 232, the second work function layer 242 is generally used to provide desired work functions for semiconductor devices to control the amount of energy needed to move electrons within semiconductor structure 200. The use of both the first work function layer 232 and the second work function layer 242 can provide additional work function control through use of two separate materials. It will be appreciated that the techniques described herein are applicable in a wide variety of semiconductor structures, and any number of work function layers may be used (or no work function layers at all). The use of two work function layers as described herein is merely an example implementation. By controlling the work function using the second work function layer 242, semiconductor device performance can be enhanced, for example by improving the threshold voltage needed to operate semiconductor devices in semiconductor structure 200. The second work function layer 242 can be an n-type metal layer (e.g., for NMOS transistors), for example, that is formed using material such as titanium nitride, tantalum, tantalum nitride, and other suitable materials and combinations thereof. The second work function layer 242 can also be a p-type metal layer (e.g., for PMOS transistors), for example, that is formed using materials such as tantalum nitride, tungsten nitride, titanium, titanium nitride, and other suitable materials and combinations thereof. The second work function layer 242 can also be formed using materials such as hafnium, zirconium, titanium, tantalum, aluminum, metal carbides (e.g., hafnium carbide, zirconium carbide, titanium carbide, aluminum carbide, etc.), aluminides, ruthenium, palladium, platinum, cobalt, nickel, conductive metal oxides, and other suitable materials and combinations thereof. The thickness and/or the composition of the second work function layer 242 can be fine-tuned to adjust the work function level. It should be understood that the shapes of the first and second work function layers, shown in FIG. 1B (and some of the following figures), are non-limiting examples, these work function layers may each be formed in any of various shapes, while remaining within the scope of the present disclosure. For example, although the work function layer 242 (as shown) is formed as a number of islands discretely disposed along the surface of the work function layer 232, the work function layer 242 may be formed as a continuous (e.g., conformal) layer over the work function layer 232, in some other embodiments. The second work function layer 242 can be formed using a variety of suitable deposition processes, including physical vapor deposition, chemical vapor deposition, electrochemical deposition, atomic layer deposition, and other suitable processes and combinations thereof.

Semiconductor structure 200 is also shown to include a mask layer 252. Mask layer 252 can be formed using various materials including metals and metal compounds such as aluminum oxide, titanium oxide, silicon oxide, tantalum oxide, gallium oxide, and other suitable materials and combinations thereof. Mask layer 252 can be formed using a variety of suitable deposition processes, including physical vapor deposition, chemical vapor deposition, electrochemical deposition, atomic layer deposition, and other suitable processes and combinations thereof. In some embodiments, mask layer 252 is a hardmask layer that protects fin 222 during etching steps. A hardmask, for example, can be more suitable for wet etching processes involving strong etchants than a softer mask. These strong etchants can penetrate through anti-reflective coating (discussed below) and create a chemical reaction with mask layer 252. This chemical reaction can create metal by-products that stick up to anti-reflective coating 270 to form one or more blisters (bubble defects). These defects can create off-target work functions within semiconductor structure 200, as well as other undesirable effects.

To help address these issues, semiconductor structure 200 is also shown to include a passivation layer 262, which may be nitride-based. Such a nitride-based passivation layer 262 can protect fin 222 (as well as the first work function layer 232 and the second work function layer 242) during the fabrication process. Passivation layer 262 can be formed using processes such as nitrogen-containing plasma treatment and/or thermal treatment to form a nitrogen-contained passivation layer or crystallization over mask layer 252. For example, the passivation layer 262 can include a nitride-based material such as, aluminum nitride (AlN), titanium nitride (TiN), silicon nitride (SiN), tantalum nitride (TaN), gallium nitride (GaN), magnesium nitride ($Mg_3N_2$), and boron nitride (BN), and other nitrogen-contained metal films. Passivation layer 262 is generally a film that is formed on top of mask layer 252 to prevent the formation of blisters as discussed above among other undesirable effects during the fabrication process. The use of passivation layer 262 can provide similar advantages as the passivation layer 152 (and 154-158) can, and thus, the discussions are not repeated.

Semiconductor structure 200 is also shown to include an anti-reflective coating 270, which is a patternable layer. Anti-reflective coating 270 can be implemented as a bottom anti-reflective coating (BARC) layer, for example. Anti-reflective coating 270 is generally used to facilitate photolithography processes by controlling reflectivity. Anti-reflective coating 270 can control reflectivity through careful selection of material to control the refractive index of anti-reflective coating 270 as well as the thickness of anti-reflective coating 270. Anti-reflective coating 270 can be formed using a variety of materials such as silicon oxide, silicon nitride, silicon oxynitride, amorphous carbon, titanium oxide, titanium oxynitride, and other suitable materials and combinations thereof. Anti-reflective coating 270 can be formed using a variety of suitable processes, such as chemical vapor deposition, physical vapor deposition, electrochemical deposition, atomic layer deposition, and other suitable processes and combinations thereof.

Semiconductor structure 200 is also shown to include a fin 224, a first work function layer 234, a second work function layer 244, a mask layer 254, and a passivation layer 264. These structures are similar to or the same as fin 222, the first work function layer 232, the second work function layer 242, mask layer 252, and passivation layer 262, respectively. These structures are formed in a dark region 292 of semiconductor structure 100 where anti-reflective coating 270 is applied. Semiconductor structure 200 is also shown to include an open region 294 where anti-reflective coating 270 is not applied. Open region 294 is shown to include a fin 226, a first work function layer 236, a second work function layer 246, a mask layer 256, a passivation layer 266, a fin 228, a first work function layer 238, a second work function layer 248, a mask layer 258, and a passivation layer 268. These structures are also similar to or the same as fin 122, the first work function layer 132, the second work function layer 142, and passivation layer 152, respectively.

Figure 2A:
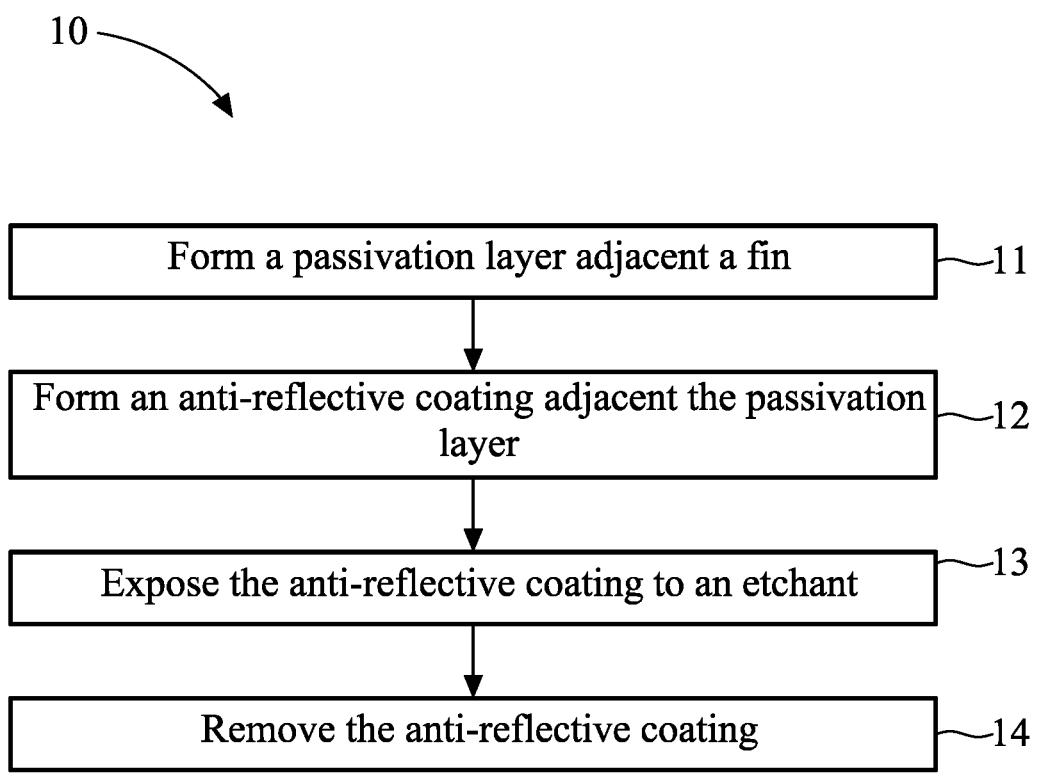
FIG. 2A illustrates a flow diagram of an example process for fabricating the example semiconductor structure of FIG. 1A, in accordance with some embodiments.
Figure 2B:
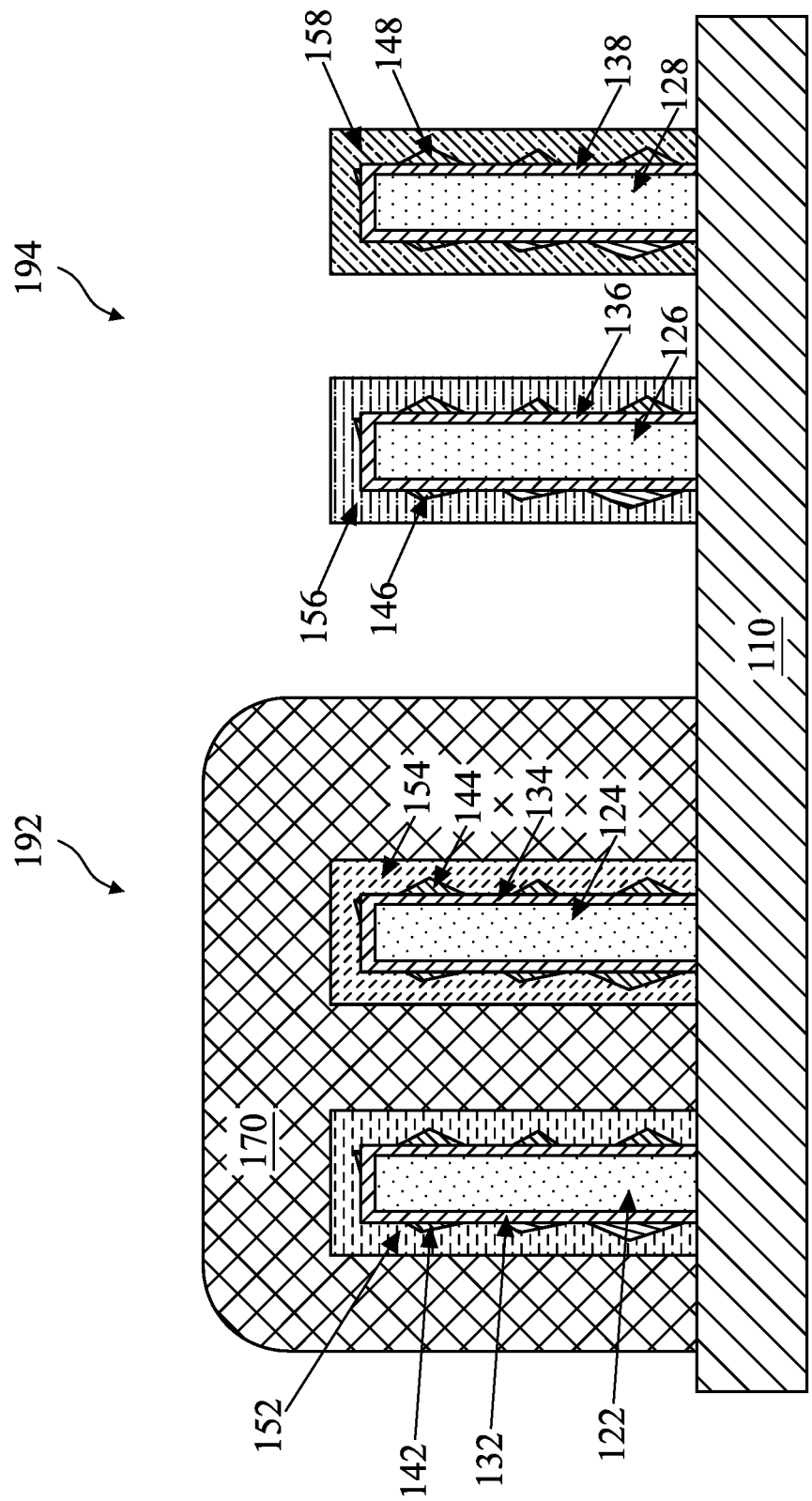
FIGS. 2B-2D illustrate cross sections of the example semiconductor structure of FIG. 1A during the process of FIG. 2A, in accordance with some embodiments.
Figure 2C:
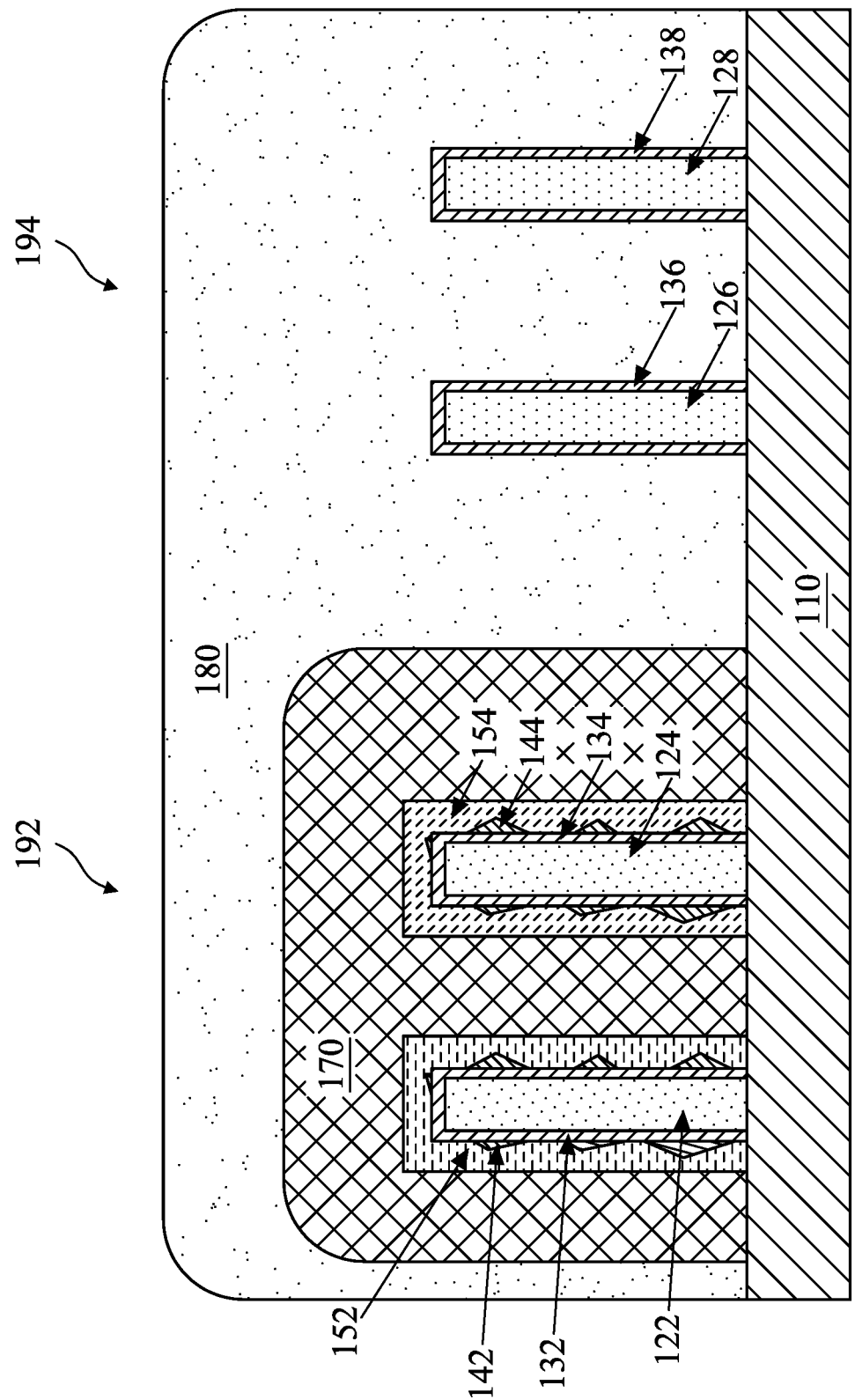
Figure 2D:
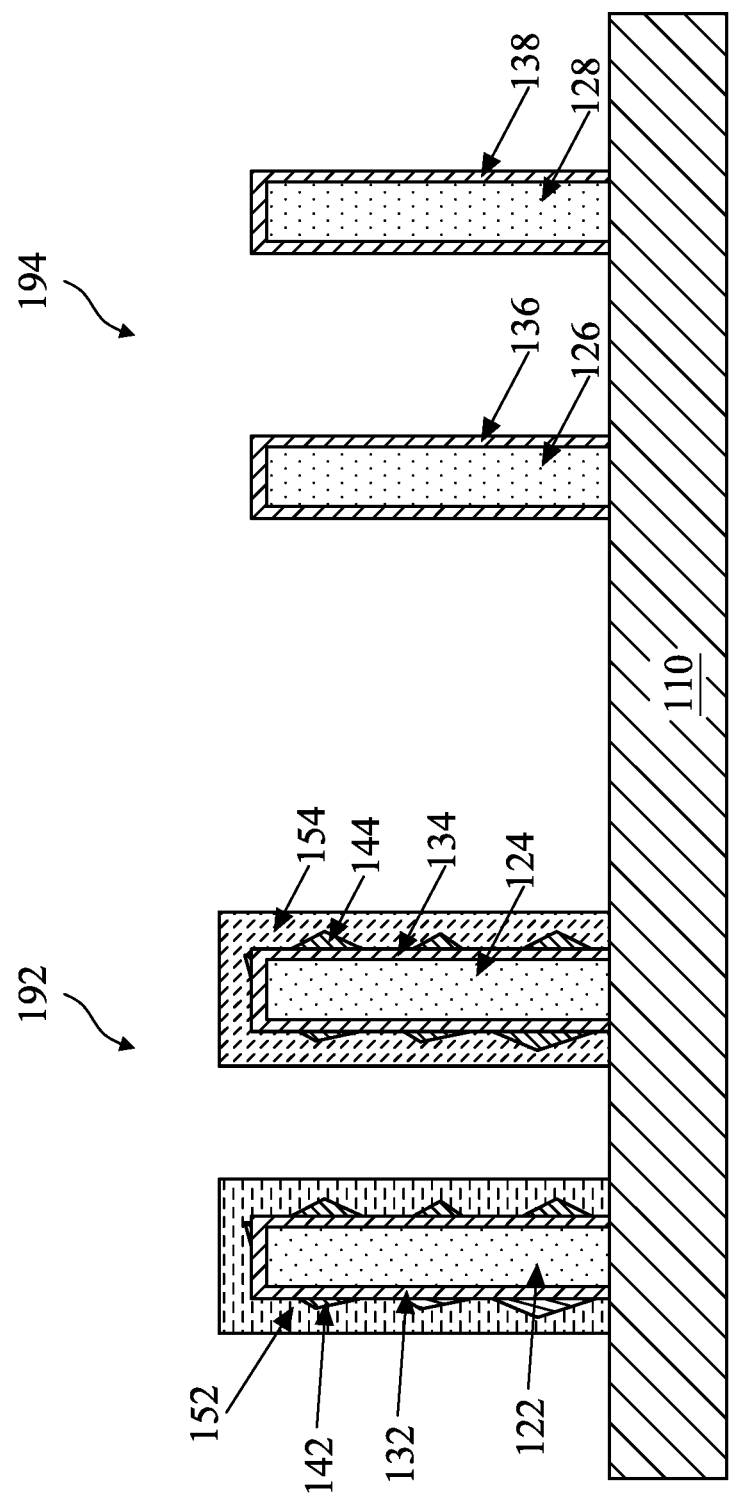

Referring now to FIG. 2A, a flow diagram illustrating an example process 10 for fabricating semiconductor structure 100 is shown, in accordance with some embodiments. FIGS. 2B-2D illustrate cross sections of semiconductor structure 100 at various operations of process 10, in accordance with various embodiments. Process 10 is generally used to prevent defects that may otherwise be formed during the fabrication of semiconductor structure 100. For example, when using a hardmask layer such as an aluminum oxide mask layer in the existing technologies, chemical reactions may occur between anti-reflective coating 170 and such an oxide-based hardmask layer during wet etching processes. These chemical reactions can lead to undesirable defects such as blisters and bubble defects. Process 10 generally involves forming using a passivation layer in place of such a hardmask layer to prevent such chemical reactions and the associated defects.

It is noted that the process 10 is merely an example, and is not intended to limit the present disclosure. Accordingly, it is understood that additional operations may be provided before, during, and after the process 10 of FIG. 2A, and that some other operations may only be briefly described herein. For example, prior to the process 10, a dummy gate structure may be formed over a (e.g., central) portion of a fin that protrudes from a substrate. Next, non-overlaid portions of the fin may be removed to form source/drain recesses, which enables source/drain structures to epitaxially grow from the source/drain recesses, respectively. Next, an interlayer dielectric (ILD) is formed over the source/drain structures. Next, the dummy gate structure is removed to form a gate trench, which exposes the previously overlaid portion of the fin. Operations of the process 10, which will be discussed below, may be performed to form various features over the gate trench.

At a operation 11, a passivation layer is formed adjacent a fin (FIG. 2B). As illustrated in FIG. 2B, passivation layer 152 is formed adjacent fin 122. Passivation layer 152 is also formed adjacent the first work function layer 132 and the second work function layer 142. Also illustrated in FIG. 2B, passivation layer 154 is formed adjacent fin 124, passivation layer 156 is formed adjacent fin 126, and passivation layer 158 is formed adjacent fin 128. Passivation layer 152, passivation layer 154, passivation layer 156, and passivation layer 158 can be formed using a variety of suitable deposition processes, including physical vapor deposition, chemical vapor deposition, electrochemical deposition, atomic layer deposition, and other suitable processes and combinations thereof. Passivation layer 152, passivation layer 154, passivation layer 156, and passivation layer 158 can be formed using a variety of suitable materials and combinations thereof, such as aluminum nitride, titanium nitride, silicon nitride, tantalum nitride, gallium nitride, magnesium nitride, and boron nitride, and other suitable materials. Passivation layer 152, passivation layer 154, passivation layer 156, and passivation layer 158 generally replace a typical hardmask layer (e.g., aluminum oxide layer) that may otherwise be used.

At a operation 12, an anti-reflective coating is formed adjacent the passivation layer (FIG. 2B). As illustrated in FIG. 2B, anti-reflective coating 170 is formed adjacent passivation layer 152 and passivation layer 154 in dark region 192 of semiconductor structure 100, but not in open region 194 of semiconductor structure 100. In some embodiments, anti-reflective coating 170 is a BARC layer. Anti-reflective coating 170 can be formed using a variety of materials such as silicon oxide, silicon nitride, silicon oxynitride, amorphous carbon, titanium oxide, titanium oxynitride, and other suitable materials and combinations thereof. Anti-reflective coating 170 can be formed using a variety of suitable processes, such as chemical vapor deposition, physical vapor deposition, electrochemical deposition, atomic layer deposition, and other suitable processes and combinations thereof. Anti-reflective coating 170 is generally used to facilitate photolithography processes by controlling reflectivity. Anti-reflective coating 170 can control reflectivity through careful selection of material to control the refractive index of anti-reflective coating 170 as well as the thickness of anti-reflective coating 170, depending on the intended application.

At a operation 13, the anti-reflective coating is exposed to an etchant (FIG. 2C). As illustrated in FIG. 2C, an etchant 180 is applied over both dark region 192 and open region 194 of semiconductor structure 100. Etchant 180 can be a variety of different types of etchants, including wet etchant solutions such as a hydrogen chloride aqueous solution, among other types of etchants such as hydrofluoric acid, phosphoric acid, sulfuric acid, hydrogen peroxide, and ammonium hydroxide. High intensity light may be used along with other photolithography operations in operation 13. As illustrated in FIG. 2C, when open region 194 is exposed to etchant 180, passivation layer 156 and passivation layer 158 are removed from fin 126 and fin 128, respectively. The second work function layer 146 and the second work function layer 148 may also be removed in operation 13, in some embodiments. However, in the dark region 192, passivation layer 152 and passivation layer 154 may remain substantially intact in operation 13 because they are protected by anti-reflective coating 170. Moreover, with forming the nitride-based passivation layers 152 and 154, the anti-reflective coating 170 can firmly attach to the passivation layers 152 and 154, which makes the etchant 180 difficult to react with the passivation layers 152 and 154

At a operation 14, the anti-reflective coating is removed (FIG. 2D). As illustrated in FIG. 2D, anti-reflective coating 170 has been removed from dark region 192. Anti-reflective coating 170 can be removed using a variety of suitable processes, including dry etching processes, wet etching processes, ashing process, and various combinations thereof. Further, a variety of different types of etchants can be used to remove anti-reflective coating 170 in operation 14. After removal of anti-reflective coating 170 in operation 14, passivation layer 152 and passivation layer 154 generally remain intact, without defects that may otherwise occur due to its chemical reactions with the etchant 180.

Figure 3A:
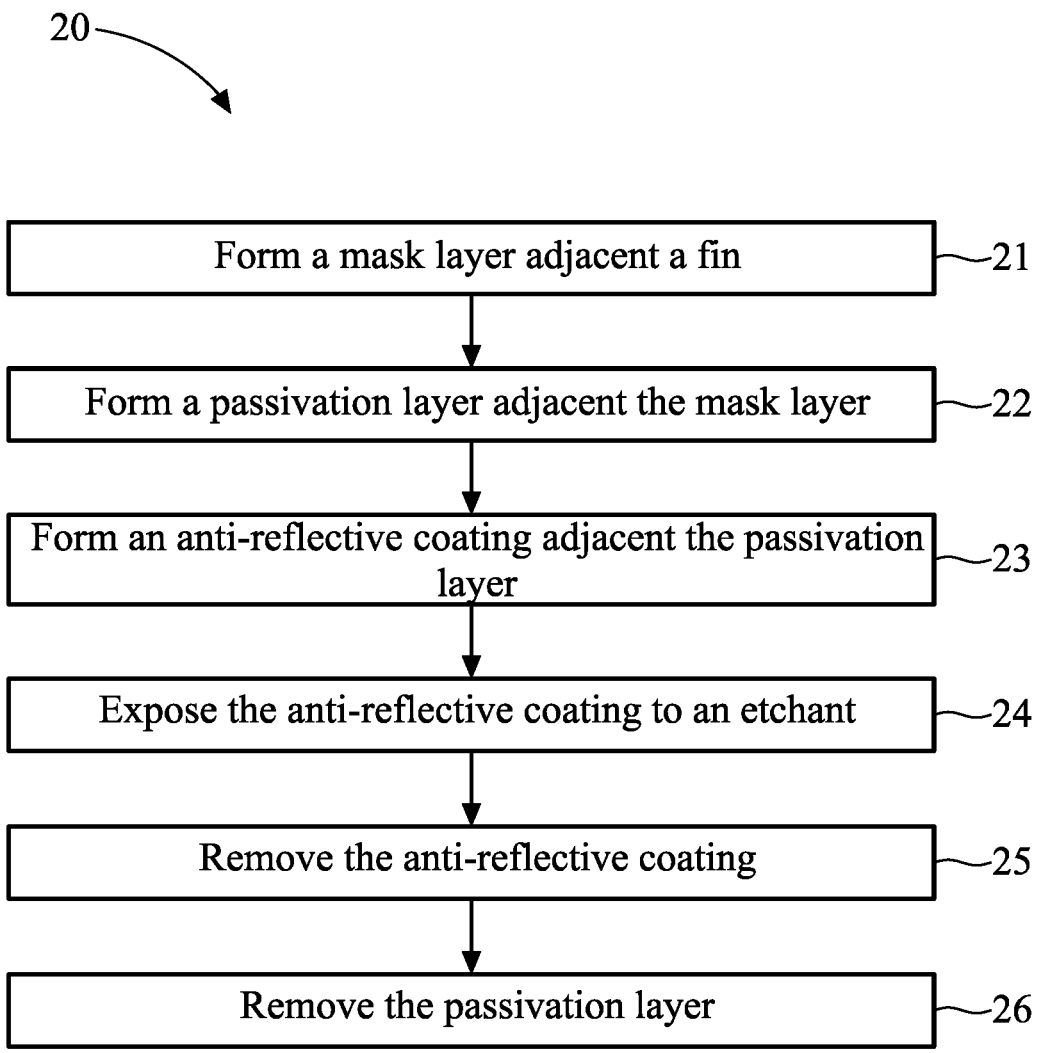
FIG. 3A illustrates a flow diagram of an example process for fabricating the example semiconductor structure of FIG. 1B, in accordance with some embodiments.

Referring now to FIG. 3A, a flow diagram illustrating an example process 20 for fabricating semiconductor structure 200 is shown, in accordance with some embodiments. FIGS. 3B-3G illustrate cross sections of semiconductor structure 200 at various operations of process 20, in accordance with various embodiments. Process 20 is generally used to prevent defects that may otherwise be formed during the fabrication of semiconductor structure 200. For example, when using a hardmask layer such as an aluminum oxide mask layer in the existing technologies, chemical reactions may occur between anti-reflective coating 170 and such an oxide-based hardmask layer during wet etching processes. These chemical reactions can lead to undesirable defects such as blisters and bubble defects. Process 20 generally involves forming a nitride-based passivation layer over an oxide-based hardmask layer to prevent such chemical reactions and the associated defects.

It is noted that the process 20 is merely an example, and is not intended to limit the present disclosure. Accordingly, it is understood that additional operations may be provided before, during, and after the process 20 of FIG. 3A, and that some other operations may only be briefly described herein. For example, prior to the process 20, a dummy gate structure may be formed over a (e.g., central) portion of a fin that protrudes from a substrate. Next, non-overlaid portions of the fin may be removed to form source/drain recesses, which enables source/drain structures to epitaxially grow from the source/drain recesses, respectively. Next, an interlayer dielectric (ILD) is formed over the source/drain structures. Next, the dummy gate structure is removed to form a gate trench, which exposes the previously overlaid portion of the fin. Operations of the process 20, which will be discussed below, may be performed to form various features over the gate trench.

Figure 3B:
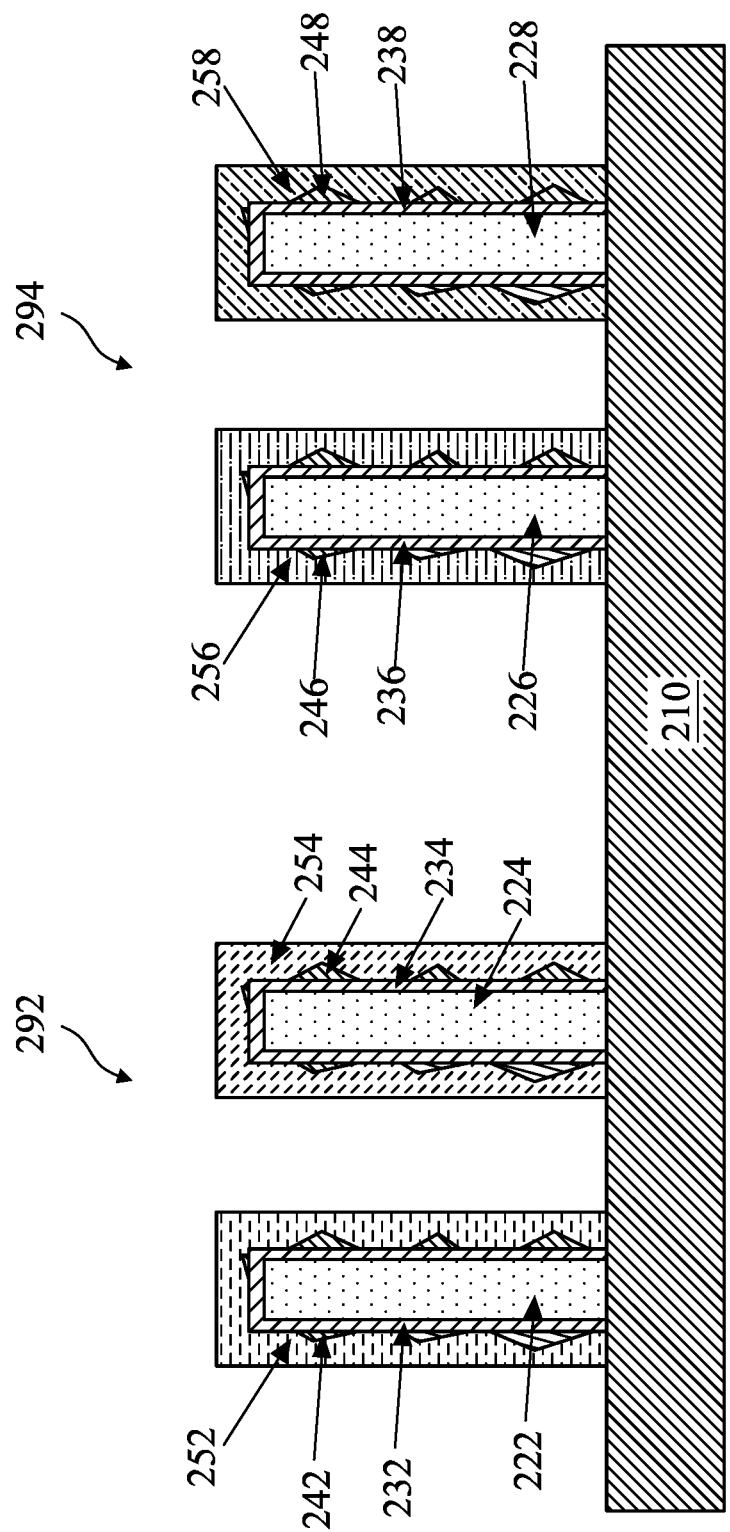
FIGS. 3B-3G illustrate cross sections of the example semiconductor structure of FIG. 1B during the process of FIG. 3A, in accordance with some embodiments.

At a operation 21, a mask layer is formed adjacent a fin (FIG. 3B). As illustrated in FIG. 3B, mask layer 252 is formed adjacent fin 222. Mask layer 252 is also formed adjacent the first work function layer 232 and the second work function layer 242. Also illustrated in FIG. 3B, mask layer 254 is formed adjacent fin 224, mask layer 256 is formed adjacent fin 226, and mask layer 258 is formed adjacent fin 228. Mask layer 252, mask layer 254, mask layer 256, and mask layer 258 can be formed using a variety of suitable deposition processes, including physical vapor deposition (PVD), chemical vapor deposition (CVD), electrochemical deposition, atomic layer deposition (ALD), and other suitable processes and combinations thereof. Mask layer 252, mask layer 254, mask layer 256, and mask layer 258 can be formed using various materials including metals and metal compounds such as aluminum oxide, titanium oxide, silicon oxide, tantalum oxide, gallium oxide, and other suitable materials and combinations thereof. Mask layer 252, mask layer 254, mask layer 256, and mask layer 258 generally protect fin 222, fin 224, fin 226, and fin 228 during various etching operations.

Figure 3C:
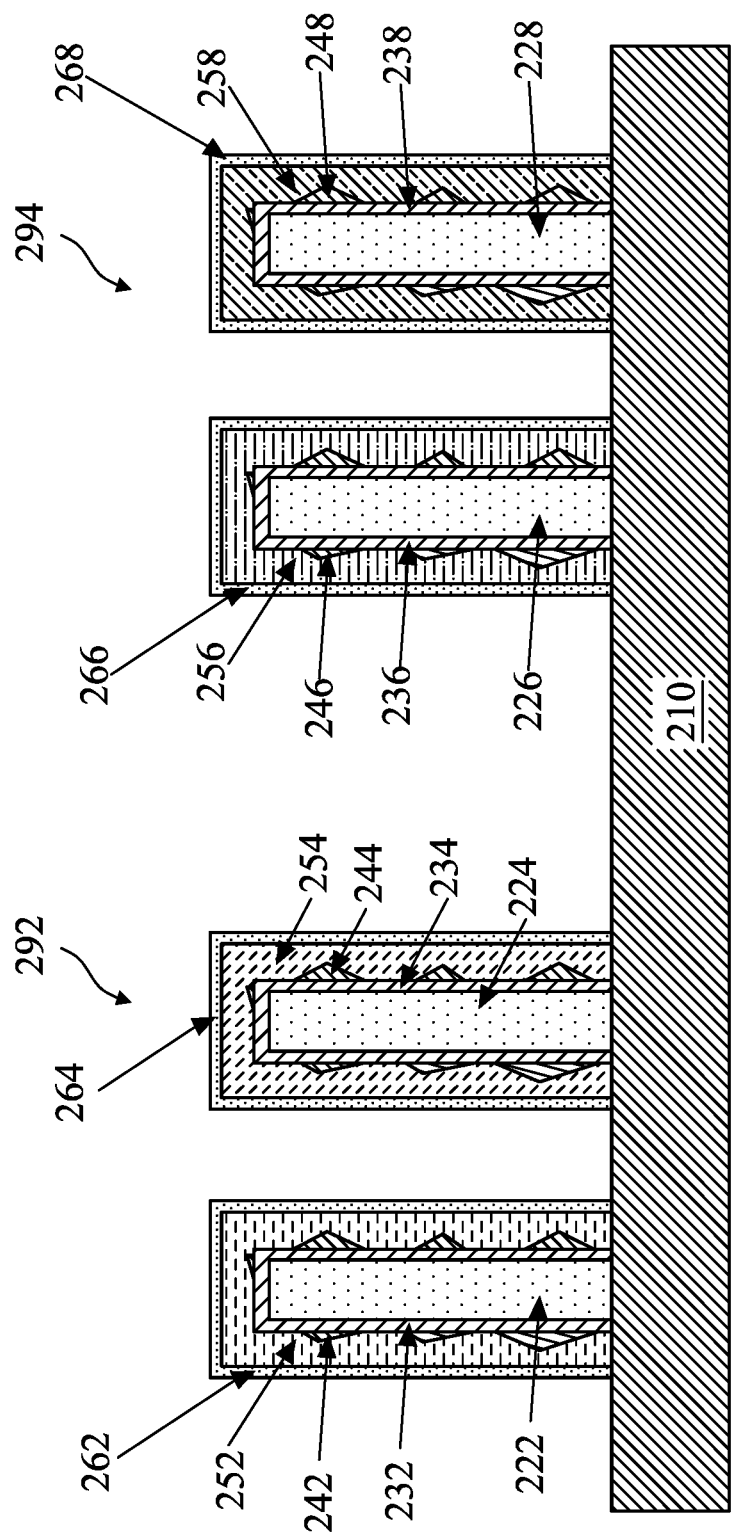

At a operation 22, a nitride-based passivation layer is formed adjacent the mask layer (FIG. 3C). As illustrated in FIG. 3C, passivation layer 262 is formed adjacent mask layer 252. Also illustrated in FIG. 3C, passivation layer 264 is formed adjacent mask layer 254, passivation layer 266 is formed adjacent mask layer 256, and passivation layer 268 is formed adjacent mask layer 258. Passivation layer 262, passivation layer 264, passivation layer 266, and passivation layer 268 can be formed using processes such as plasma treatment and/or thermal treatment to form a nitrogen-contained ($N_2$) passivation layer or crystallization over respective surface of mask layer 252, mask layer 254, mask layer 256, and mask layer 258. By tuning conditions of the plasma treatment and/or thermal treatment, such passivation layers 262 through 268 may have a substantially thin thickness, which is not greater than about 20 angstroms (Å). Passivation layer 262, passivation layer 264, passivation layer 266, and passivation layer 268 can be formed using a variety of suitable materials and combinations thereof, such as aluminum nitride, titanium nitride, silicon nitride, tantalum nitride, gallium nitride, magnesium nitride, and boron nitride, other nitrogen-contained metal films, and other suitable materials. Passivation layer 262, passivation layer 264, passivation layer 266, and passivation layer 268 are generally films that are used to prevent the formation of blisters and other undesirable effects that may occur during the fabrication process.

Figure 3D:
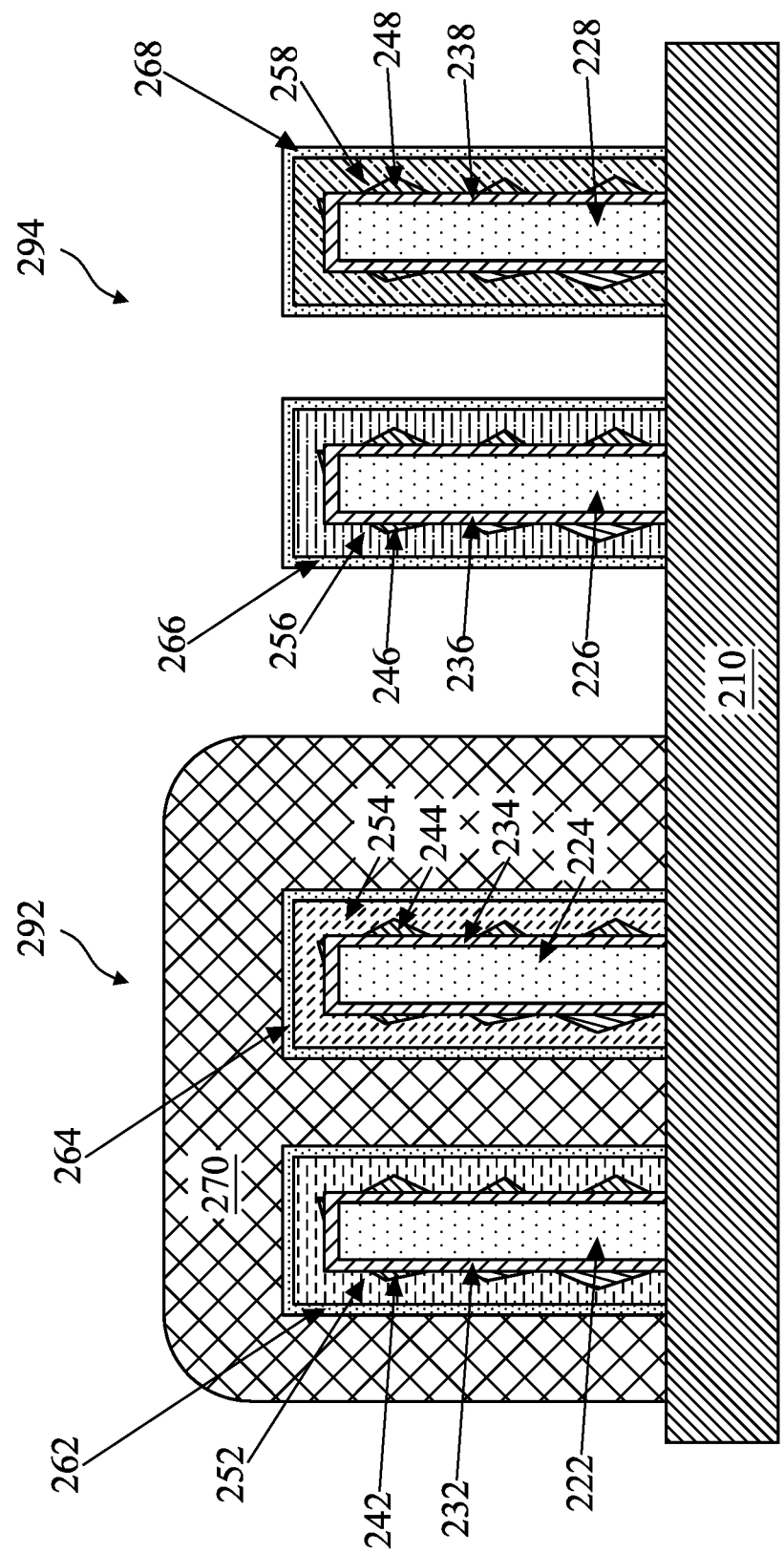

At a operation 23, an anti-reflective coating is formed adjacent the passivation layer (FIG. 3D). As illustrated in FIG. 3D, anti-reflective coating 270 is formed adjacent passivation layer 262 and passivation layer 264 in dark region 292 of semiconductor structure 200, but not in open region 294 of semiconductor structure 200. In some embodiments, anti-reflective coating 270 is a BARC layer. Anti-reflective coating 270 can be formed using a variety of materials such as silicon oxide, silicon nitride, silicon oxynitride, amorphous carbon, titanium oxide, titanium oxynitride, and other suitable materials and combinations thereof. Anti-reflective coating 270 can be formed using a variety of suitable processes, such as chemical vapor deposition, physical vapor deposition, electrochemical deposition, atomic layer deposition, and other suitable processes and combinations thereof. Anti-reflective coating 270 is generally used to facilitate photolithography processes by controlling reflectivity. Anti-reflective coating 270 can control reflectivity through careful selection of material to control the refractive index of anti-reflective coating 270 as well as the thickness of anti-reflective coating 270, depending on the intended application.

Figure 3E:
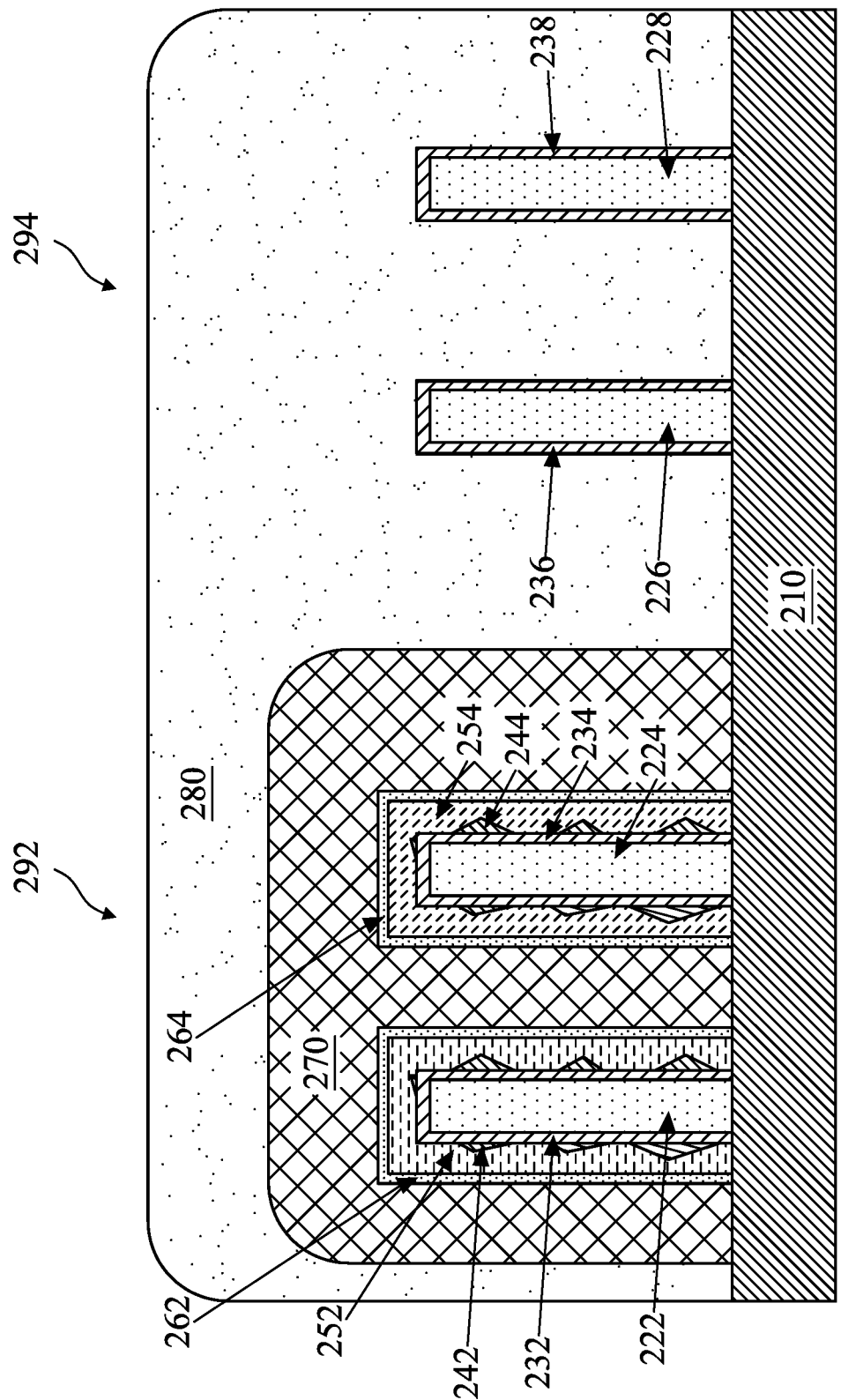

At a operation 24, the anti-reflective coating is exposed to an etchant (FIG. 3E). As illustrated in FIG. 3E, an etchant 280 is applied over both dark region 292 and open region 294 of semiconductor structure 200. Etchant 280 can be a variety of different types of etchants, including wet etchant solutions such as a hydrogen chloride aqueous solution, among other types of etchants such as hydrofluoric acid, phosphoric acid, sulfuric acid, hydrogen peroxide, and ammonium hydroxide. High intensity light may be used along with other photolithography operations in operation 24. As illustrated in FIG. 3E, when open region 294 is exposed to etchant 280, mask layer 256, passivation layer 266, mask layer 258, and passivation layer 268 are removed from fin 226 and fin 228, respectively. The second work function layer 246 and the second work function layer 248 may also be removed in operation 24, in some embodiments. However, in the dark region 292, passivation layer 262 and passivation layer 264 may remain substantially intact in operation 24 because they are protected by anti-reflective coating 270. Moreover, with forming the nitride-based passivation layers 262 and 264, the anti-reflective coating 270 can firmly attach to the passivation layers 262 and 264, which makes the etchant 280 difficult to react with the passivation layers 262 and 264.

Figure 3F:
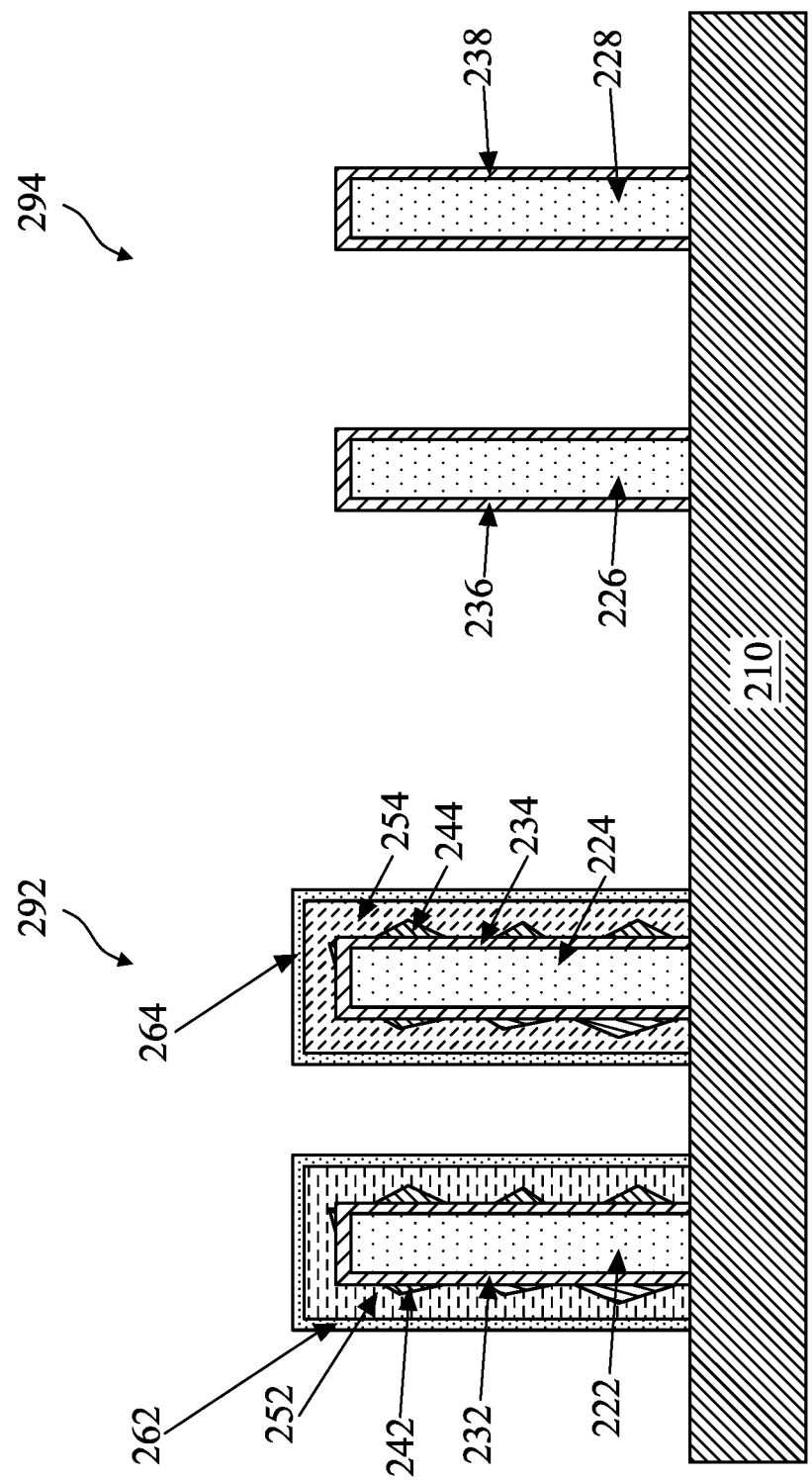

At a operation 25, the anti-reflective coating is removed (FIG. 3F). As illustrated in FIG. 3F, anti-reflective coating 270 has been removed from dark region 292. Anti-reflective coating 270 can be removed using a variety of suitable processes, including dry etching processes, wet etching processes, and various combinations thereof. Further, a variety of different types of etchants can be used to remove anti-reflective coating 270 in operation 25. After removal of anti-reflective coating 270 in operation 25, mask layer 252, passivation layer 262, mask layer 254, and passivation layer 264 generally remain intact, without defects that may otherwise occur due to chemical reactions between etchant 280 and anti-reflective coating 270.

Figure 3G:
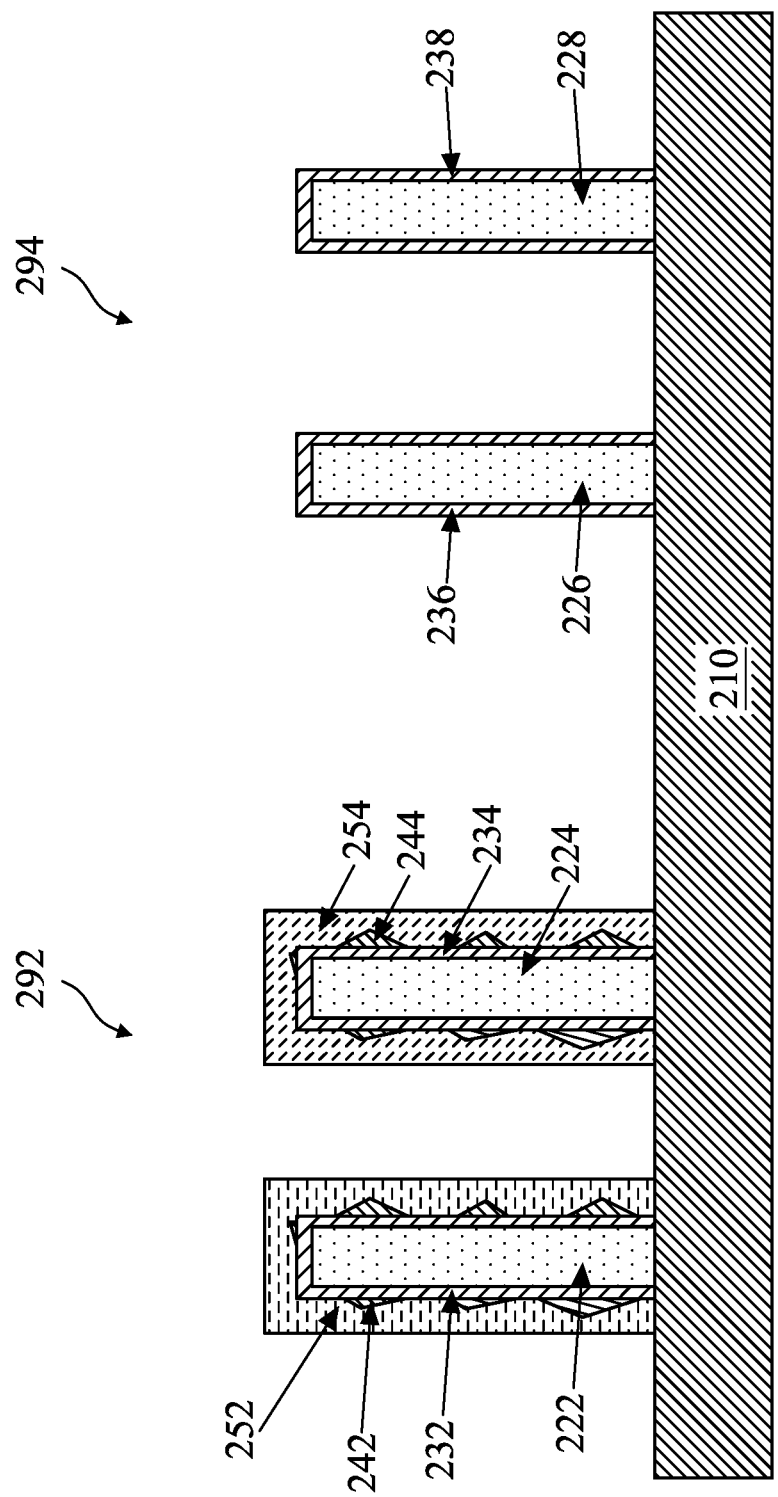

At a operation 26, the passivation layer is removed (FIG. 3G). As illustrated in FIG. 3G, passivation layer 262 and passivation layer 264 have been removed. Passivation layer 262 and passivation layer 264 can be removed using a variety of suitable processes, including dry etching processes, wet etching processes, and various combinations thereof. Further, a variety of different types of etchants can be used to remove passivation layer 262 and passivation layer 264 in operation 26. After the removal of passivation layer 262 and passivation layer 264 in operation 26, mask layer 252 and mask layer 254 continue to protect fin 222 and fin 224, respectively, during the remainder of the fabrication process. However, use of passivation layer 262 and passivation layer 264 in process 20 prevents bubble defects and other undesirable effect from occurring.

An implementation of the present disclosure is a method for making a semiconductor structure. The method includes forming a mask layer adjacent a fin, forming a passivation layer adjacent the mask layer, forming an anti-reflective coating adjacent the passivation layer, exposing the anti-reflective coating to an etchant, removing the anti-reflective coating, and removing the passivation layer.

Another implementation of the present disclosure is another method of fabricating a semiconductor structure. The method includes forming a passivation layer adjacent a fin, forming an anti-reflective coating adjacent the passivation layer, exposing the anti-reflective coating to an etchant, and removing the anti-reflective coating.

Yet another implementation of the present disclosure is yet another method of fabricating a semiconductor structure. The method includes forming a layer of aluminum nitride adjacent a fin, forming an anti-reflective coating adjacent the layer of aluminum nitride, exposing the anti-reflective coating to an etchant, and removing the anti-reflective coating.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor structure, comprising:
   forming a first fin and a second fin over a substrate;
   forming one or more work function layers over the first and the second fins;
   forming a mask layer over the one or more work function layers, wherein one of the work function layers extends along an entire sidewall of the mask layer;
   performing a surface treatment to the mask layer to form a nitride-based film over the mask layer;
   covering the first fin with a patternable layer; and
   removing a second portion of the nitride-based film from the second fin, while leaving a first portion of the nitride-based film over the first fin intact.

2. The method of claim 1, wherein the patternable layer includes an anti-reflective coating.

3. The method of claim 1, wherein the nitride-based film includes a material selected from the group consisting of aluminum nitride, titanium nitride, silicon nitride, tantalum nitride, gallium nitride, magnesium nitride, boron nitride, and combinations thereof.

4. The method of claim 1, wherein the mask layer is in direct contact with the one of the work function layers.

5. The method of claim 1, wherein the step of forming the mask layer includes forming an oxide-based film over the one or more work function layers.

6. The method of claim 1, wherein the step of performing the surface treatment includes performing a nitrogen-containing plasma treatment and/or thermal treatment on a surface of the mask layer.

7. The method of claim 1, further comprising removing the first portion of the nitride-based film from the first fin.

8. The method of claim 1, wherein the mask layer includes a material selected from the group consisting of: aluminum oxide, titanium oxide, silicon oxide, tantalum oxide, gallium oxide, or combinations thereof.

9. The method of claim 1, wherein the nitride-based film has a thickness not greater than about 20 angstroms.

10. A method for making a semiconductor structure, comprising:
    exposing a portion of a first fin and a portion of a second fin by forming a first gate trench and a second gate trench, respectively;
    forming at least one work function metal over the first and the second gate trenches;
    forming an oxide-based metal film over the first and the second gate trenches, wherein the oxide-based metal film is free of direct contact with an entire sidewall of each of the first and the second fins;
    treating the oxide-based metal film to form a nitride-based metal film over a surface of the oxide-based metal film;
    attaching a patternable layer to a first portion of the nitride-based metal film; and
    removing a second portion of the nitride-based metal film and a portion of the oxide-based metal film from the second gate trench, while leaving the first portion of the nitride-based metal film over the first gate trench intact.

11. The method of claim 10, further comprising removing the first portion of the nitride-based metal film from the first gate trench.

12. The method of claim 10, wherein the nitride-based metal film includes a material selected from the group consisting of: aluminum nitride, titanium nitride, silicon nitride, tantalum nitride, gallium nitride, magnesium nitride, boron nitride, or combinations thereof.

13. The method of claim 10, wherein the oxide-based metal film includes a material selected from the group consisting of: aluminum oxide, titanium oxide, silicon oxide, tantalum oxide, gallium oxide, or combinations thereof.

14. The method of claim 10, wherein the nitride-based metal film has a thickness not greater than about 20 angstroms.

15. The method of claim 10, wherein the patternable layer includes an anti-reflective coating.

16. The method of claim 10, wherein the step of treating the oxide-based metal film further comprises performing a nitrogen-containing plasma treatment and/or thermal treatment.

17. A method for making a semiconductor structure, comprising:
    exposing a portion of a first fin and a portion of a second fin by forming a first gate trench and a second gate trench, respectively;
    forming at least one work function metal over the first and the second gate trenches;
    depositing an oxide-based film over the first and second gate trenches, wherein the at least one work function metal is sandwiched between the oxide-based film and an entire sidewall of each of the first and the second fins;
    performing a treatment process to passivate the oxide-based film with a nitride-based film in the first and the second gate trenches;
    attaching a patternable layer to a first portion of the nitride-based film; and
    removing a second portion of the nitride-based film from the second gate trench, while leaving the first portion of the nitride-based film over the first gate trench intact.

18. The method of claim 17, wherein the nitride-based film includes a material selected from the group consisting of: aluminum nitride, titanium nitride, silicon nitride, tantalum nitride, gallium nitride, magnesium nitride, boron nitride, or combinations thereof.

19. The method of claim 17, wherein the patternable layer includes an anti-reflective coating.

20. The method of claim 17, wherein the oxide-based film is in direct contact with the least one work function metal.

* * * * *